US012610862B2

(12) United States Patent
Lee et al.

(10) Patent No.: US 12,610,862 B2
(45) Date of Patent: Apr. 21, 2026

(54) RELIABILITY FOR DRAM DEVICE STACK

(71) Applicant: Rambus Inc., San Jose, CA (US)

(72) Inventors: Dongyun Lee, Sunnyvale, CA (US);
Carl W. Werner, Los Gatos, CA (US);
Torsten Partsch, San Jose, CA (US)

(73) Assignee: Rambus Inc., San Jose, CA (US)

( * ) Notice: Subject to any disclaimer, the term of this
patent is extended or adjusted under 35
U.S.C. 154(b) by 707 days.

(21) Appl. No.: 17/941,792

(22) Filed: Sep. 9, 2022

(65) Prior Publication Data

US 2023/0099474 A1        Mar. 30, 2023

Related U.S. Application Data

(60) Provisional application No. 63/248,333, filed on Sep.
24, 2021.

(51) Int. Cl.
H01L 25/065        (2023.01)
G11C 7/10        (2006.01)
G11C 8/12        (2006.01)

(52) U.S. Cl.
CPC ........ H01L 25/0657 (2013.01); G11C 7/1039
(2013.01); G11C 8/12 (2013.01); H01L
2225/06541 (2013.01)

(58) Field of Classification Search
CPC ....... H01L 25/0657; H01L 2225/06541; G11C
7/1039; G11C 8/12
See application file for complete search history.

(56) References Cited

U.S. PATENT DOCUMENTS

| | | | |
|---|---|---|---|
| 5,991,851 A * | 11/1999 | Alwais | .................. G11C 11/406 |
| | | | 711/100 |
| 8,698,321 B2 | 4/2014 | Suh | |
| 9,818,470 B2 | 11/2017 | Best et al. | |
| 10,930,363 B1 * | 2/2021 | Nishioka | ................. H01L 24/17 |

(Continued)

OTHER PUBLICATIONS

Kim, Dongkyun et al., "A 1.1-V 10-nm class 6.4-GB/s/pin 16-GB
DDR5 SDRAM With a Phase Rotator-ILO DLL, High-Speed
SerDes, and DFE/FFE Equalization Scheme for Rx/Tx", IEE Jour-
nal of Solid-State Circuits, vol. 55, No. 1, Jan. 2020, pp. 167-177.
11 pages.

(Continued)

*Primary Examiner* — Thao P Le
(74) *Attorney, Agent, or Firm* — The Neudeck Law Firm,
LLC

(57)        ABSTRACT

An interconnected stack of Dynamic Random Access
Memory (DRAM) die has a base die and DRAM dies. The
base die is interconnected vertically with the DRAM dies
using through-silicon via (TSV) connections that carry data
and control signals throughout the stack. The data signals of
the DRAM dies are interconnected vertically to the base die
using separate, non-overlapping, sets of TSVs. In a first
configuration, each die in the stack is accessed using unique
chip identification numbers. In a second configuration, a
single chip identification number is used to access two or
more dies in the stack. At least one bit of the chip identifi-
cation number may be used in determining the row being
accessed. Data communicated with dies in the stack may be
communicated with the base die using non-overlapping sets
of data signal connections.

16 Claims, 14 Drawing Sheets

(56) References Cited

U.S. PATENT DOCUMENTS

| | | | | |
|---|---|---|---|---|
| 2014/0063942 | A1* | 3/2014 | Jeddeloh | H01L 25/0657 |
| | | | | 365/185.05 |
| 2018/0254073 | A1* | 9/2018 | Frans | G11C 5/063 |
| 2019/0252009 | A1* | 8/2019 | Kang | G11C 7/10 |
| 2020/0303030 | A1* | 9/2020 | Lee | G11C 7/1096 |
| 2021/0090983 | A1* | 3/2021 | Lin | H01L 25/50 |

OTHER PUBLICATIONS

Lenovo, Samsung, SAP. Whitepaper, "Boosting the Performance of SAP S/4HANA and Analytical Banking Applications on SAP HANA", Studio SAP, 38900enUS (16/06), 2016, 21 pages.
Micron. "3-Dimensional Stack (3DS) DDR4 SDRAM, MT40A4G4, MT40A8G4, MT40A4G8", 16Gb, 32Gb: x4, x8 3DS DDR4 SDRAM Description, Micron Technology, Inc., 2018, 75 pages.

\* cited by examiner

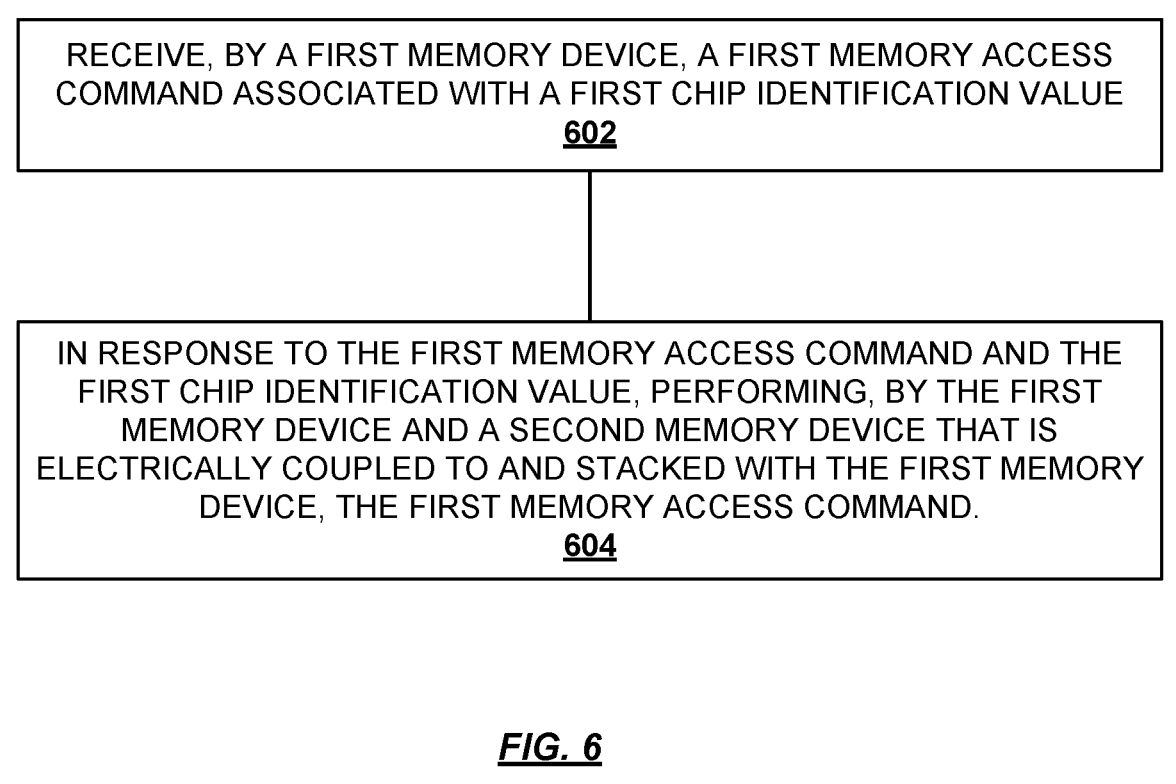

RECEIVE, BY A FIRST MEMORY DEVICE, A FIRST MEMORY ACCESS
COMMAND ASSOCIATED WITH A FIRST CHIP IDENTIFICATION VALUE
602

IN RESPONSE TO THE FIRST MEMORY ACCESS COMMAND AND THE
FIRST CHIP IDENTIFICATION VALUE, PERFORMING, BY THE FIRST
MEMORY DEVICE AND A SECOND MEMORY DEVICE THAT IS
ELECTRICALLY COUPLED TO AND STACKED WITH THE FIRST MEMORY
DEVICE, THE FIRST MEMORY ACCESS COMMAND.
604

*FIG. 6*

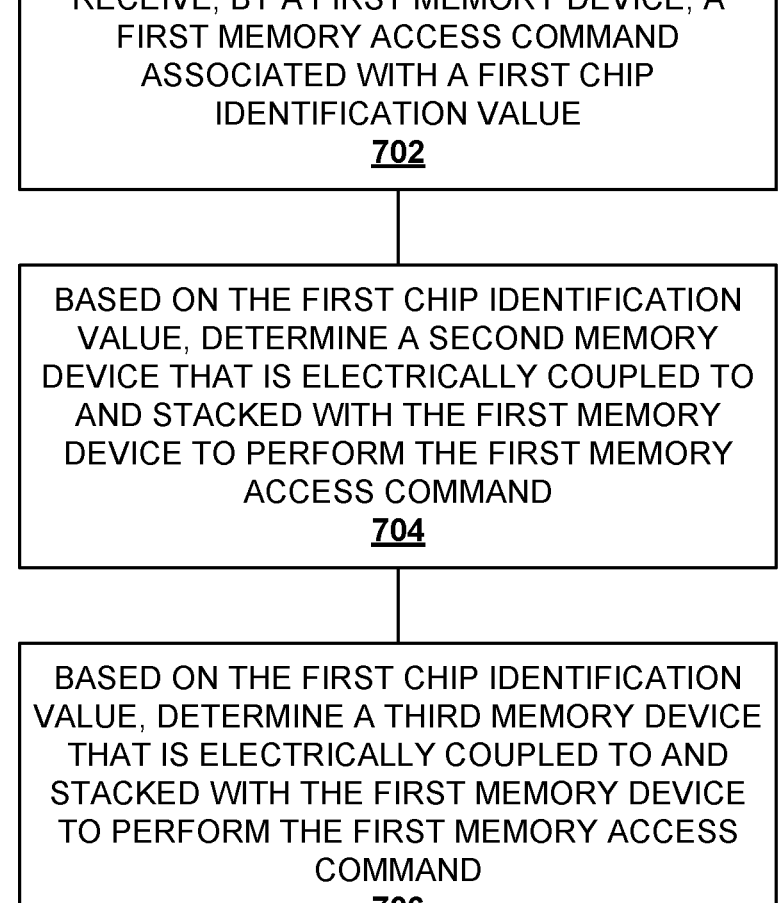

RECEIVE, BY A FIRST MEMORY DEVICE, A FIRST MEMORY ACCESS COMMAND ASSOCIATED WITH A FIRST CHIP IDENTIFICATION VALUE
702

BASED ON THE FIRST CHIP IDENTIFICATION VALUE, DETERMINE A SECOND MEMORY DEVICE THAT IS ELECTRICALLY COUPLED TO AND STACKED WITH THE FIRST MEMORY DEVICE TO PERFORM THE FIRST MEMORY ACCESS COMMAND
704

BASED ON THE FIRST CHIP IDENTIFICATION VALUE, DETERMINE A THIRD MEMORY DEVICE THAT IS ELECTRICALLY COUPLED TO AND STACKED WITH THE FIRST MEMORY DEVICE TO PERFORM THE FIRST MEMORY ACCESS COMMAND
706

COMMUNICATE DATA ASSOCIATED WITH THE FIRST MEMORY ACCESS COMMAND WITH THE SECOND MEMORY DEVICE AND THE THIRD MEMORY DEVICE
708

*FIG. 7*

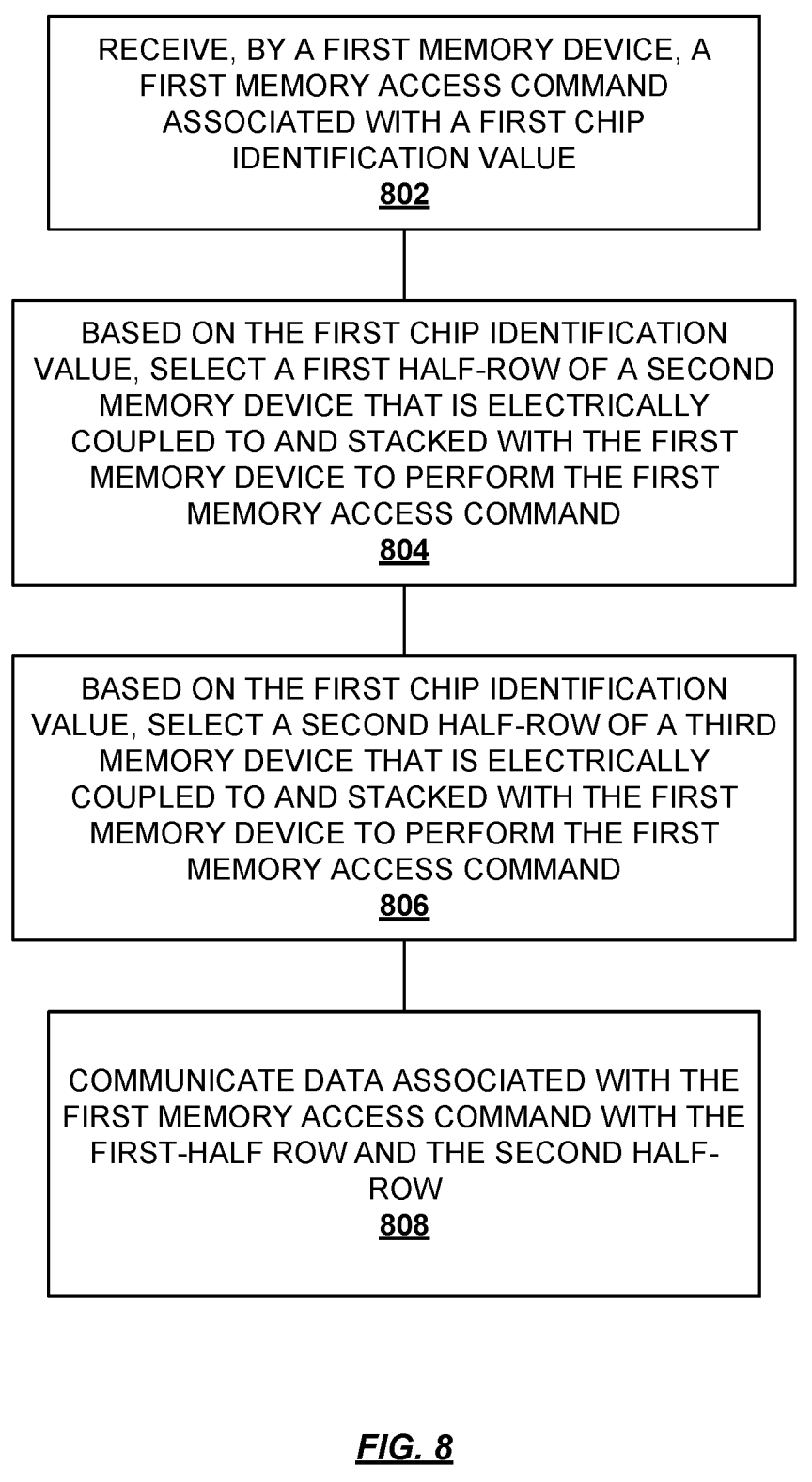

RECEIVE, BY A FIRST MEMORY DEVICE, A FIRST MEMORY ACCESS COMMAND ASSOCIATED WITH A FIRST CHIP IDENTIFICATION VALUE
802

BASED ON THE FIRST CHIP IDENTIFICATION VALUE, SELECT A FIRST HALF-ROW OF A SECOND MEMORY DEVICE THAT IS ELECTRICALLY COUPLED TO AND STACKED WITH THE FIRST MEMORY DEVICE TO PERFORM THE FIRST MEMORY ACCESS COMMAND
804

BASED ON THE FIRST CHIP IDENTIFICATION VALUE, SELECT A SECOND HALF-ROW OF A THIRD MEMORY DEVICE THAT IS ELECTRICALLY COUPLED TO AND STACKED WITH THE FIRST MEMORY DEVICE TO PERFORM THE FIRST MEMORY ACCESS COMMAND
806

COMMUNICATE DATA ASSOCIATED WITH THE FIRST MEMORY ACCESS COMMAND WITH THE FIRST-HALF ROW AND THE SECOND HALF-ROW
808

*FIG. 8*

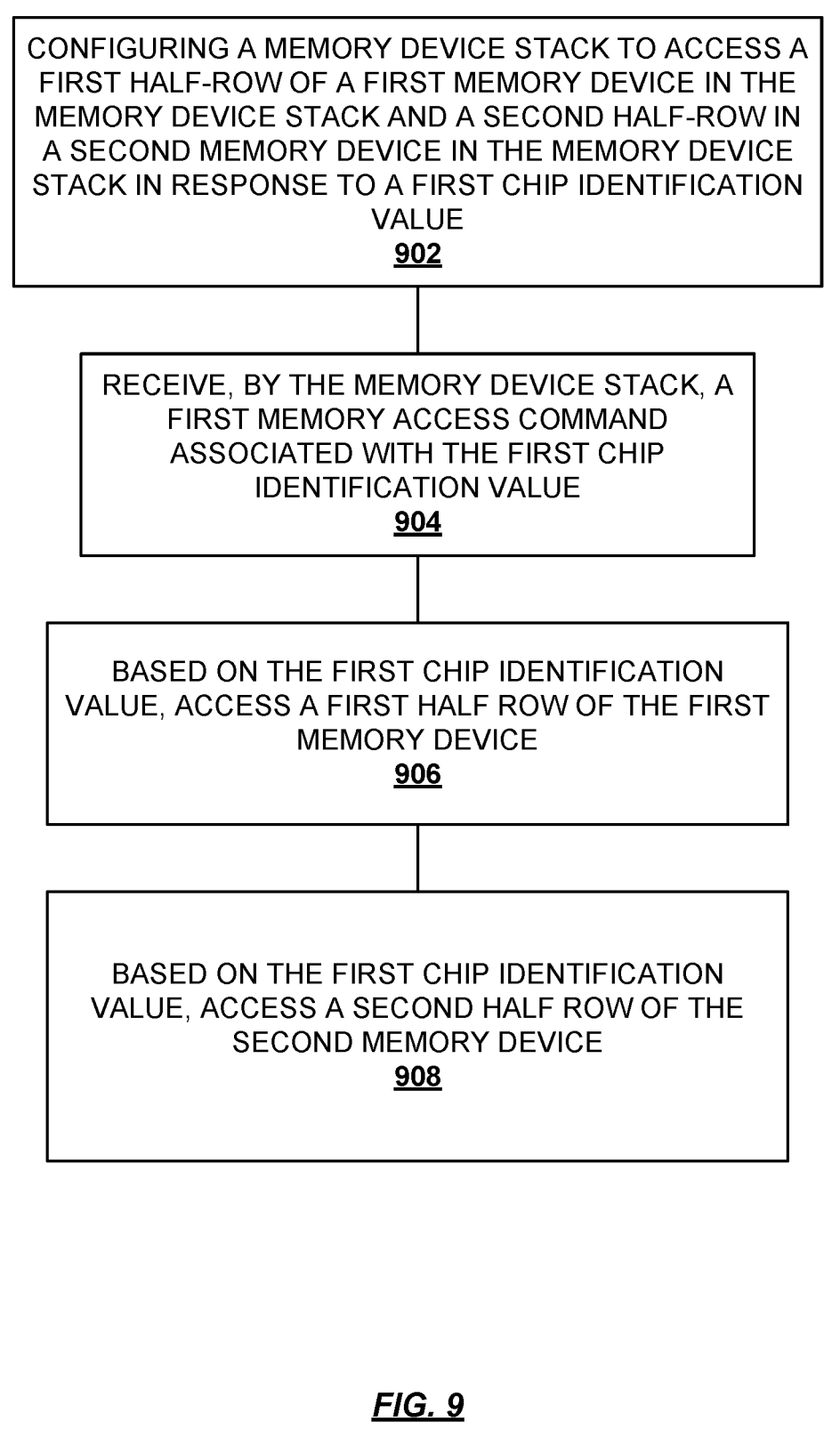

CONFIGURING A MEMORY DEVICE STACK TO ACCESS A FIRST HALF-ROW OF A FIRST MEMORY DEVICE IN THE MEMORY DEVICE STACK AND A SECOND HALF-ROW IN A SECOND MEMORY DEVICE IN THE MEMORY DEVICE STACK IN RESPONSE TO A FIRST CHIP IDENTIFICATION VALUE
902

RECEIVE, BY THE MEMORY DEVICE STACK, A FIRST MEMORY ACCESS COMMAND ASSOCIATED WITH THE FIRST CHIP IDENTIFICATION VALUE
904

BASED ON THE FIRST CHIP IDENTIFICATION VALUE, ACCESS A FIRST HALF ROW OF THE FIRST MEMORY DEVICE
906

BASED ON THE FIRST CHIP IDENTIFICATION VALUE, ACCESS A SECOND HALF ROW OF THE SECOND MEMORY DEVICE
908

*FIG. 9*

RELIABILITY FOR DRAM DEVICE STACK

BRIEF DESCRIPTION OF THE DRAWINGS

FIG. 6 is a flowchart illustrating a method of accessing multiple devices in a stack of DRAM devices.

FIG. 7 is a flowchart illustrating a method of accessing devices in a stack of DRAM devices.

FIG. 8 is a flowchart illustrating a method of accessing half-rows in a stack of DRAM devices.

FIG. 9 is a flowchart illustrating a method of accessing half-rows of two different DRAM devices in a stack.

DETAILED DESCRIPTION OF THE EMBODIMENTS

In an embodiment, an interconnected stack of one or more Dynamic Random Access Memory (DRAM) die has a base die and DRAM die. The base die is interconnected vertically with the DRAM die(s) using through-silicon via (TSV) connections that carry data and control signals throughout the stack. The base die includes at least one DRAM array. The data signals of the DRAM dies are interconnected vertically to the base die using separate, non-overlapping, sets of TSVs. In this manner, a failure of a DRAM die does not interfere with the vertical communication of the data signals to/from the other DRAM dies.

In a first configuration or mode, each die in the stack is accessed using unique chip identification numbers. In a second configuration or mode, a single chip identification number is used to access two or more dies in the stack. In the second configuration, at least one bit of the chip identification number may be used in determining the row, or section of the row, being accessed. Also in the second configuration, data communicated with the two or more dies in the stack are communicated with the base die using non-overlapping sets of data signal connections.

Figure 1:
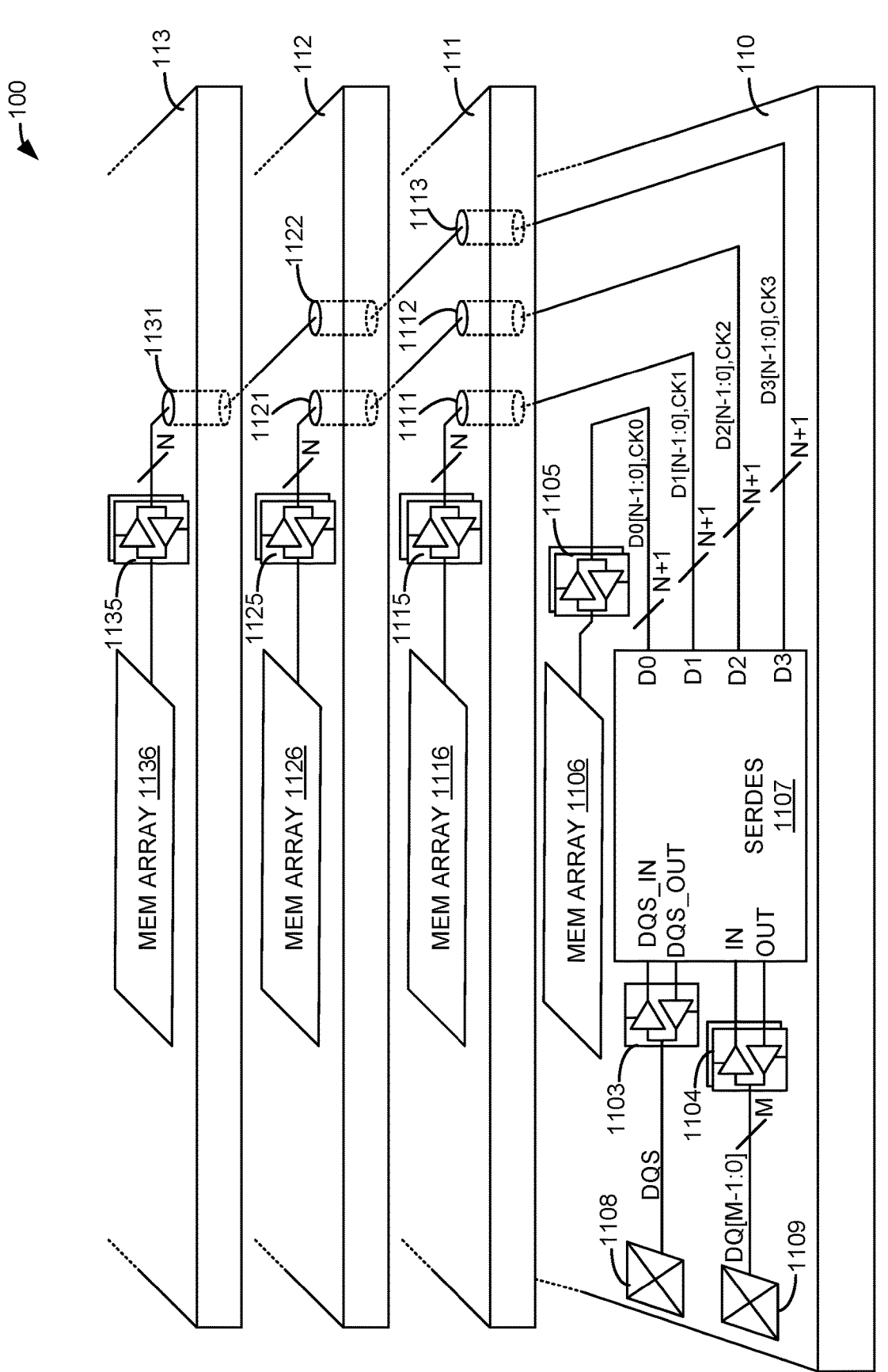
FIG. 1 is an illustration of a stack of dynamic random access memory (DRAM) devices.

FIG. 1 is an illustration of a stack of dynamic random access memory (DRAM) devices. In FIG. 1, stacked die component 100 comprises base DRAM die 110, first stacked DRAM die 111, second stacked DRAM die 112, and third stacked DRAM die 113. Base die 110 includes external data strobe (DQS) buffer 1103, external data buffers 1104, data buffers 1105, memory array 1106, serializer-deserializer (SERDES) 1107, data signal connections 1109, and data strobe signal connection 1108. First stacked die 111 includes through-silicon vias (TSVs) 1111-1113, data buffers 1115, and memory array 1116. Second stacked die 112 includes TSVs 1121-1112, data buffers 1125, and memory array 1126. Third stacked die 113 includes TSVs 1131, data buffers 1135, and memory array 1136.

In an embodiment, all dies 110-113 may be identical. Blocks and/or functions not needed (e.g., DQS buffer 1103, data buffers 1104, SERDES 1107, etc.) may be deactivated and therefore, for the sake of clarity, are not shown in FIG. 1 with respect to dies 111-113. Deactivation/activation of these blocks and/or functions may be determined by, for example, the position of the die in stacked die component 100. For example, base die 110 would activate circuitry to communicate with devices outside the stack (e.g., a controller) while the dies 111-113 stacked with base die 110 would not activate that functionality/circuitry.

Memory array 1106 of base die 110 is operatively coupled to data buffers 1105. Data buffers 1105 are operatively coupled to SERDES 1107. SERDES 1107 is operatively coupled to external data buffers 1104 and external DQS buffer 1103. External data buffers 1104 are operatively coupled to data signal connection 1109. External DQS buffer 1103 is operatively coupled to data strobe connection 1108. Memory array 1116 of die 111 is operatively coupled to data buffers 1115. Data buffers 1115 are operatively coupled to SERDES 1107 via TSVs 1111. Memory array 1126 of die 112 is operatively coupled to data buffers 1125. Data buffers 1125 are operatively coupled to SERDES 1107 via TSVs 1112 and TSVs 1121. Memory array 1136 of die 113 is operatively coupled to data buffers 1135. Data buffers 1135 are operatively coupled to SERDES 1107 via TSVs 1113, TSVs 1122, and TSVs 1131.

Note from the foregoing that memory array 1106's communication with SERDES 1107 does not rely on any active data signal connections shared by data signals to or from die 111, die 112, or die 113. Similarly, memory array 1116's communication with SERDES 1107 does not rely on any active data signal connections shared by signals to or from die 112, or die 113. Memory array 1126's communication with SERDES 1107 does not rely on any active data signal connections shared by signals to or from die 111 or die 113. Memory array 1136's communication with SERDES 1107 does not rely on any active data signal connections shared by signals to or from die 111 or die 112. Thus, it should be understood that the data connections running through stacked die component 100 from dies 111-113 with base dies are not shared among dies 111-113. Because these connections are not shared with active circuitry on the other dies, a failure in the active circuitry of a die 111-113 does not affect the ability of the other dies 111-113 to communicate data with base die 110.

In an embodiment, a chip identification number received by base die 110 via a command/address (CA) bus (not shown in FIG. 1) determines which of dies 110-113 (and therefore memory arrays 1106-1136) is to communicate data via SERDES 1107 and data signal connections 1109. This embodiment may be enabled, disabled, and/or configured via a mode register or mode indicator used by, or stored by, base die 110 and/or dies 111-113. Thus, in this mode or configuration, each die 110-113 is addressed by a unique chip identification number. For example, base die 110 may decode the chip identification number and transmit an die select signal to the selected die 110-113. In another example, each die 110-113 may be configured with a unique chip identification number (e.g., setting a register) that, when matched by a received chip identification number (e.g., received via one or more CA busses running vertically through stacked die component 100) cause the matching die 110-113 to select itself.

When dies 110-113 are configured to respond to unique chip identification numbers, SERDES 1107 is configured to communicate each data burst with a single die 110-113. Thus, for example, an entire N-bit (e.g., 32 bit) data burst would be communicated to/from a single die 110-113 (and therefore a single memory array 1106-1136) by SERDES 1107. The communication to/from the single die 110-113 may be timed by a respective clock signal or strobe CK0-CK3. This burst may be communicated via data signal connections 1109 using M bits (e.g., 1 bit, 2 bits) communicated concurrently (i.e., in parallel).

In an embodiment, a chip identification number received by base die 110 via a command/address (CA) bus (not shown in FIG. 1) determines which of two dies 110-113 (and therefore two memory arrays 1106-1136) is to communicate data via SERDES 1107 and data signal connections 1109. This embodiment may be enabled, disabled, and/or configured via a mode register or mode indicator used by, or stored by, base die 110 and/or dies 111-113. Thus, in this mode or configuration, pairs of die 110-113 are addressed by a single unique chip identification number. For example, base die 110 may decode the chip identification number, determine that the received chip identification number addresses die 111 and die 113. Base die 110 may then transmit a first die select signal the first selected die 111 and a second die select signal to die 113. In other words, both dies 111 and 113 are accessed by a single command in response to a single chip identification number.

Table 1 and Table 2 detail example pairings of dies 110-113 that are accessed in response to chip identification number values. In Table 1 and Table 2, base die 110 corresponds to die #0, die #1 corresponds to the next die 111 up in the stack, and so on. In an embodiment, the translations illustrated by Table 1 or Table 2 may be configured into base die 110 (e.g., by registers, lookup table, etc.)

TABLE 1

| 16 die stack | 8 die stack | 4 die stack | CID3 | CID2 | CID1 | CID0 | CID (hex) |
|---|---|---|---|---|---|---|---|
| 0 & 2 | 0 & 2 | 0 & 2 | 0 | 0 | 0 | 0 | 0 |
| 1 & 3 | 1 & 3 | 1 & 3 | 0 | 0 | 0 | 1 | 1 |
| 2 & 0 | 2 & 0 | 2 & 0 | 0 | 0 | 1 | 0 | 2 |
| 3 & 1 | 3 & 1 | 3 & 1 | 0 | 0 | 1 | 1 | 3 |
| 4 & 6 | 4 & 6 | | 0 | 1 | 0 | 0 | 4 |
| 5 & 7 | 5 & 7 | | 0 | 1 | 0 | 1 | 5 |
| 6 & 4 | 6 & 4 | | 0 | 1 | 1 | 0 | 6 |
| 7 & 5 | 7 & 5 | | 0 | 1 | 1 | 1 | 7 |
| 8 & 10 | | | 1 | 0 | 0 | 0 | 8 |
| 9 & 11 | | | 1 | 0 | 0 | 1 | 9 |
| 10 & 8 | | | 1 | 0 | 1 | 0 | A |
| 11 & 9 | | | 1 | 0 | 1 | 1 | B |
| 12 & 14 | | | 1 | 1 | 0 | 0 | C |
| 13 & 15 | | | 1 | 1 | 0 | 1 | D |
| 14 & 12 | | | 1 | 1 | 1 | 0 | E |
| 15 & 13 | | | 1 | 1 | 1 | 1 | F |

*Die #'s accessed*

TABLE 2

| 16 die stack | 8 die stack | 4 die stack | CID3 | CID2 | CID1 | CID0 | CID (hex) |
|---|---|---|---|---|---|---|---|
| 0 & 8 | 0 & 4 | 0 & 2 | 0 | 0 | 0 | 0 | 0 |
| 1 & 9 | 1 & 5 | 1 & 3 | 0 | 0 | 0 | 1 | 1 |
| 2 & 10 | 2 & 6 | 2 & 0 | 0 | 0 | 1 | 0 | 2 |
| 3 & 11 | 3 & 7 | 3 & 1 | 0 | 0 | 1 | 1 | 3 |
| 4 & 12 | 4 & 0 | | 0 | 1 | 0 | 0 | 4 |
| 5 & 13 | 5 & 1 | | 0 | 1 | 0 | 1 | 5 |
| 6 & 14 | 6 & 2 | | 0 | 1 | 1 | 0 | 6 |
| 7 & 15 | 7 & 3 | | 0 | 1 | 1 | 1 | 7 |
| 8 & 0 | | | 1 | 0 | 0 | 0 | 8 |
| 9 & 1 | | | 1 | 0 | 0 | 1 | 9 |

*Die #'s accessed*

TABLE 2-continued

| 16 die stack | 8 die stack | 4 die stack | CID3 | CID2 | CID1 | CID0 | CID (hex) |
|---|---|---|---|---|---|---|---|
| 10 & 2 | | | 1 | 0 | 1 | 0 | A |
| 11 & 3 | | | 1 | 0 | 1 | 1 | B |
| 12 & 4 | | | 1 | 1 | 0 | 0 | C |
| 13 & 5 | | | 1 | 1 | 0 | 1 | D |
| 14 & 6 | | | 1 | 1 | 1 | 0 | E |
| 15 & 7 | | | 1 | 1 | 1 | 1 | F |

*Die #'s accessed*

When pairs of die are accessed in response to a single chip identification number, SERDES 1107 is configured to communicate each data burst with the two addressed die of dies 110-113. Thus, for example, to communicate an entire 2*N-bit (e.g., 2*N=32 bits) half of the data burst would be communicated to/from a first die 110-113 and half be communicated to/from a second die 110-113 (and therefore communicated with a selected two memory arrays 1106-1136) by SERDES 1107. The communication to/from each of the two addressed die 110-113 may be timed by a respective clock signal or strobe CK0-CK3. This burst may be communicated via data signal connections 1109 using M bits (e.g., M=1 bit, M=2 bits, etc.) communicated concurrently (i.e., in parallel). In an embodiment, SERDES 1107 communicates M/2 bits to/from each of the two die in parallel in each burst timeslot.

If one row in each of the two dies is activated when the access command to the pair of dies is an activate (ACT) command, the power is doubled relative to activating only one die. Also, the number of bits activated (page size) would double compared to the first access mode. In an embodiment, the CID code (see Tables 1 & 2) of the chip identification number may be used by dies 110-113 to determine a portion (e.g., half-row) of the addressed row that is to be activated. Thus, the repurposed CID bits may be used by the row decoder logic. In this manner, the increase in power consumption that results from activating two (or more) die 110-113 at the same time may be mitigated or eliminated. Also, the page size stays equal to the page size if only one die is activated (first mode).

In an embodiment, SERDES 1107 may time multiplex the bits communicated with the two dies. For example, if base die 110 and die 112 are being accessed using a single chip identification number, the data to/from stacked die component 100, as communicated via data signal connections 1109, may be interleaved M-bits from base die 110 followed by M-bits from die 112, followed by M-bits from base die 110, and so on. In an embodiment, M=4.

Figure 2A:
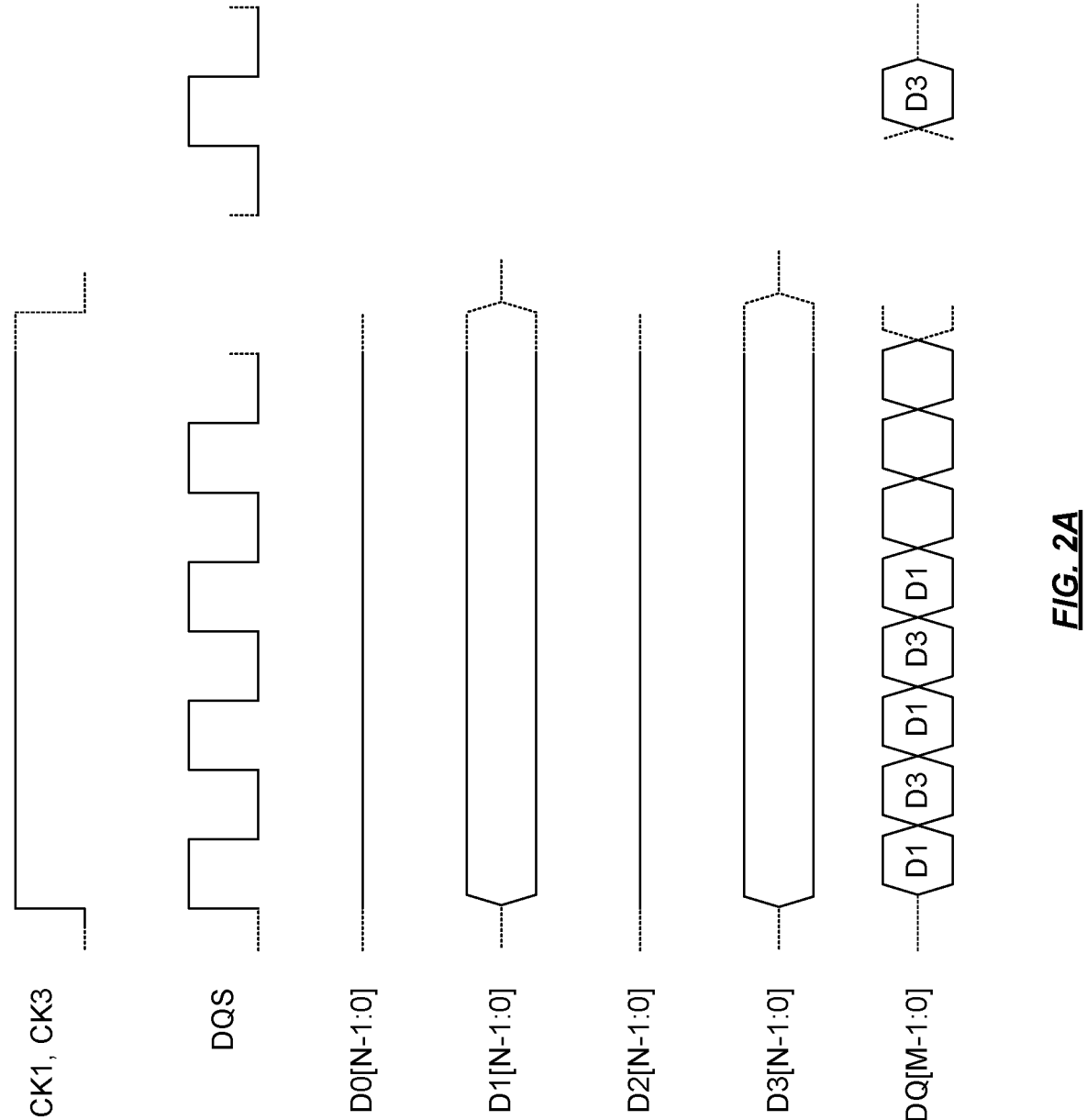
FIG. 2A is a timing diagram illustrating an example of read access of a pair of dies in a stack.

FIG. 2A is a timing diagram illustrating an example of read access of a pair of dies in a stack. In FIG. 2A, two dies 111 and 113 are accessed concurrently (e.g., in response to a single chip identification number). The first die and the second die each output N bits of data D1[N−1:0] and D3[N−1:0], respectively, in parallel. SERDES 1107 receives the D1[N−1:0] signals from die 111 at the D1 interface of SERDES 1107. SERDES 1107 receives the D3[N−1:0] signals from die 113 at the D3 interface of SERDES 1107. SERDES 1107 interleaves the signals in D1[N−1:0] and D3[N−1:0] in time at outputs them M bits at a time. In other words, for example, if N=16, and M=1, SERDES 1107 outputs the following 1-bit sequence on one DQ signal: D1[0], D3[0], D1[1], D3[1], and so on. In another example, if N=16 and M=4, SERDES 1107 outputs the following sequence of nibbles on 4 DQ signal lines (DQ[0:3]): D1[0:

3], D3[0:3], D1[4:7], D3[4:7], and so on. Finally, for example, if N=16 and M=2, SERDES 1107 outputs the following sequence of pairs of bits on two DQ signal lines (DQ[0:1]): D1[0:1], D3[0:1], D1[2:3], D3[2:3], and so on.

Figure 2B:
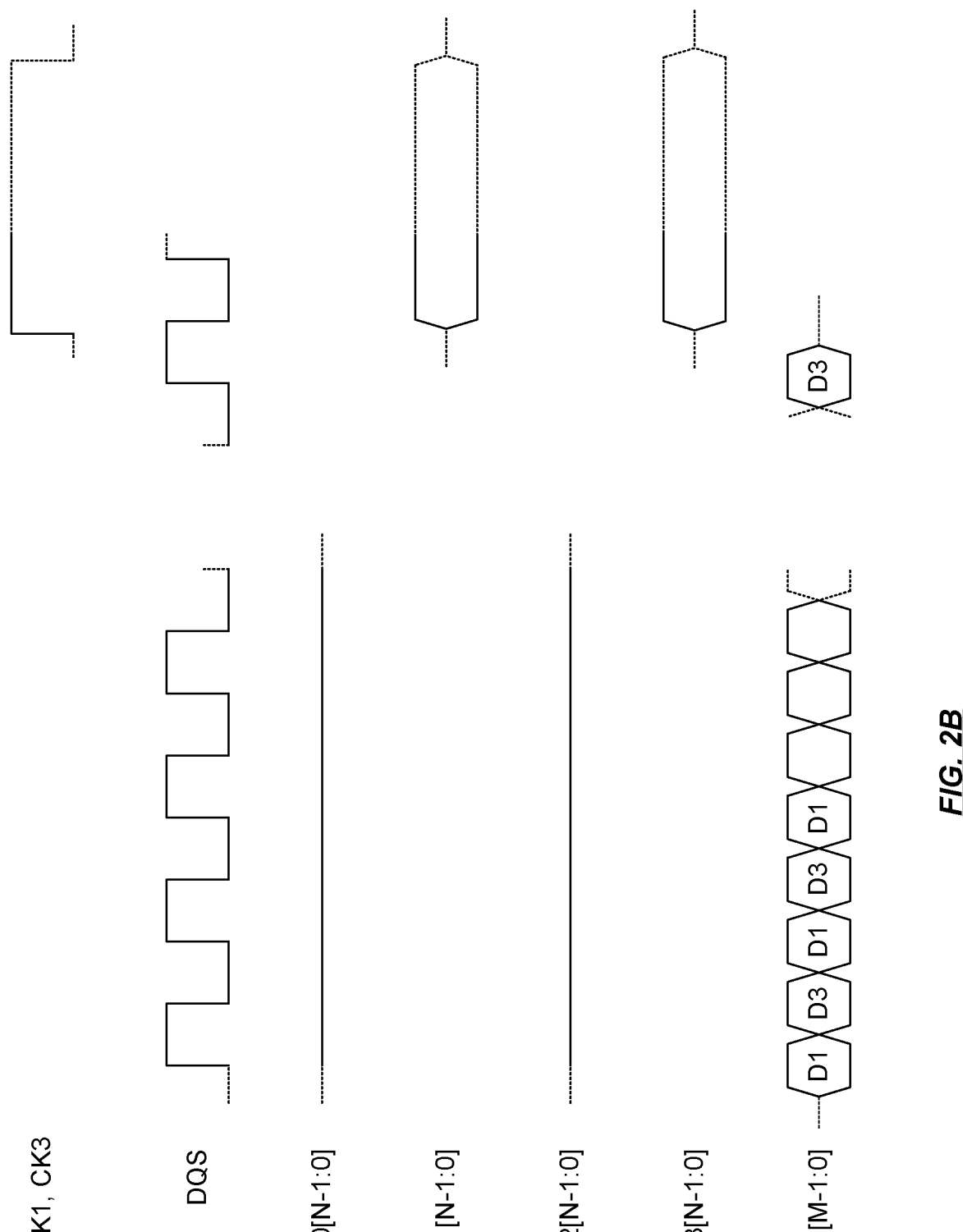
FIG. 2B is a timing diagram illustrating an example of write access of a pair of dies in a stack.

FIG. 2B is a timing diagram illustrating an example of write access of a pair of dies in a stack. In FIG. 2B, two dies 111 and 113 are accessed concurrently (e.g., in response to a single chip identification number). SERDES 1107 receives the interleaved D1[N−1:0] and D2[N−1:0] data on M number of DQ signal lines DQ[M−1:0]. SERDES 1107 deinterleaves the received data and, once all of the burst is received, outputs D1[N−1:0] to die 111 and D3[N−1:0] to die 113. This is illustrated in FIG. 2B by the valid D1[N−1] and D3[N−1:0] occurring after the last M bits of DQ data (destined for die 113) is received via DQ[M−1:0].

Figure 2C:
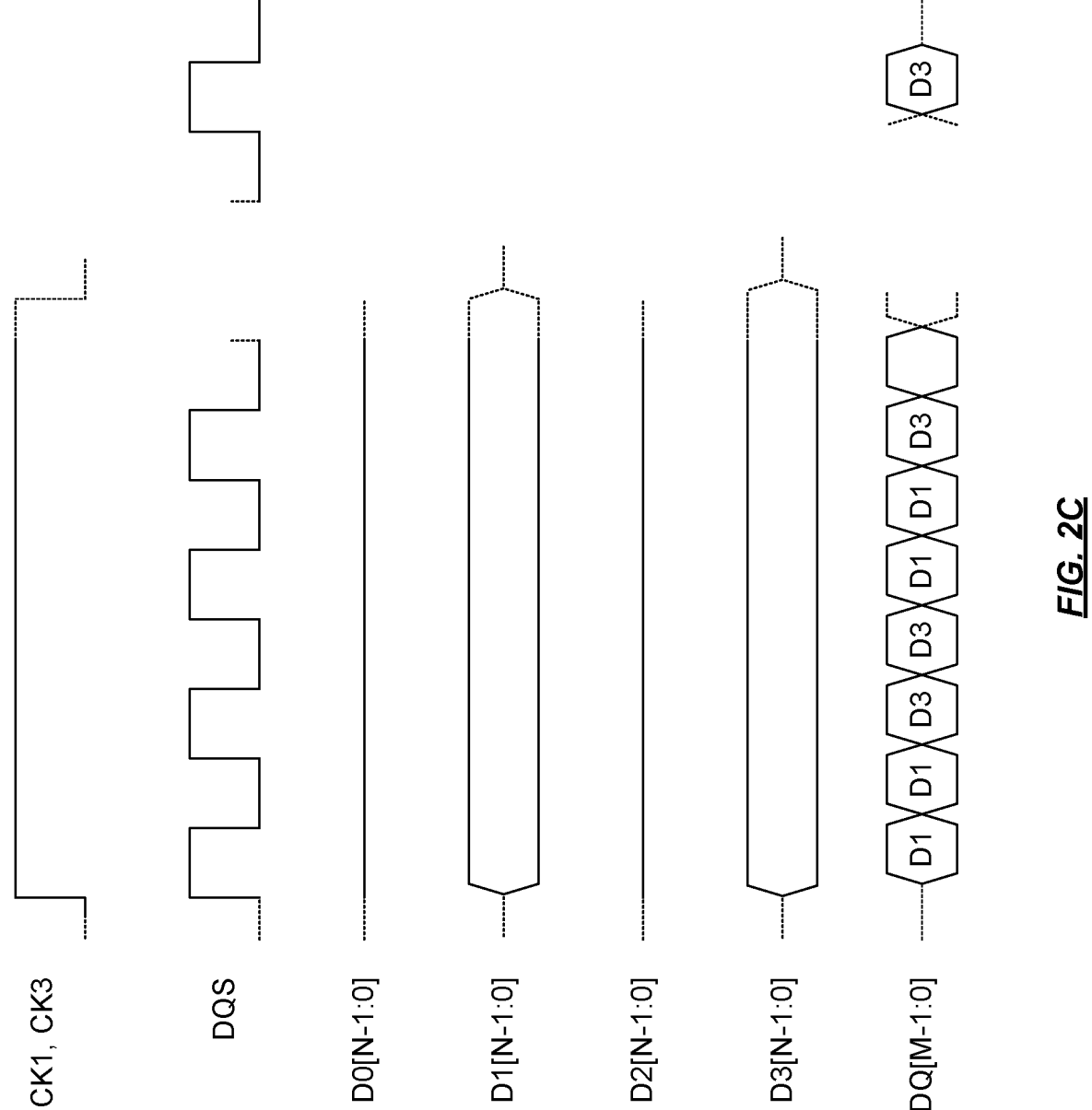
FIG. 2C is a timing diagram illustrating another example of read access of a pair of dies in a stack.

FIG. 2C is a timing diagram illustrating another example of read access of a pair of dies in a stack. FIG. 2C is similar to FIGS. 2A-2B except for a different interleaving pattern. In FIGS. 2A-2B, data to/from die 111 and die 113 is alternated in each successive burst timeslot. In FIG. 2C, data to/from die 111 and die 113 is alternated after two successive burst time slots.

In FIG. 2C, two dies 111 and 113 are accessed concurrently (e.g., in response to a single chip identification number). The first die and the second die each output N bits of data D1[N−1:0] and D3[N−1:0], respectively, in parallel. SERDES 1107 receives the D1[N−1:0] signals from die 111 at the D1 interface of SERDES 1107. SERDES 1107 receives the D3[N−1:0] signals from die 113 at the D3 interface of SERDES 1107. SERDES 1107 interleaves the signals in D1[N−1:0] and D3[N−1:0] in time every two time slots and outputs them M bits at a time. In other words, for example, if N=16, and M=1, SERDES 1107 outputs the following 1-bit sequence on one DQ signal: D1[0], D1[1], D3[0], D3[1], D1[2], D1[3], D3[2], D3[3], and so on. In another example, if N=16 and M=4, SERDES 1107 outputs the following sequence of nibbles on 4 DQ signal lines (DQ[0:3]): D1[0:3], D1[4:7], D3[0:3], D3[4:7], D1[8:11], D1[12:15], and so on. Finally, for example, if N=16 and M=2, SERDES 1107 outputs the following sequence of pairs of bits on two DQ signal lines (DQ[0:1]): D1[0:1], D1[2:3], D3[0:1], D3[2:3], D1[4:5], D1[6:7], and so on. It should be understood that corresponding interleaving patterns may be used with write operations to a pair of concurrently accessed die in a stack.

Figure 3A:
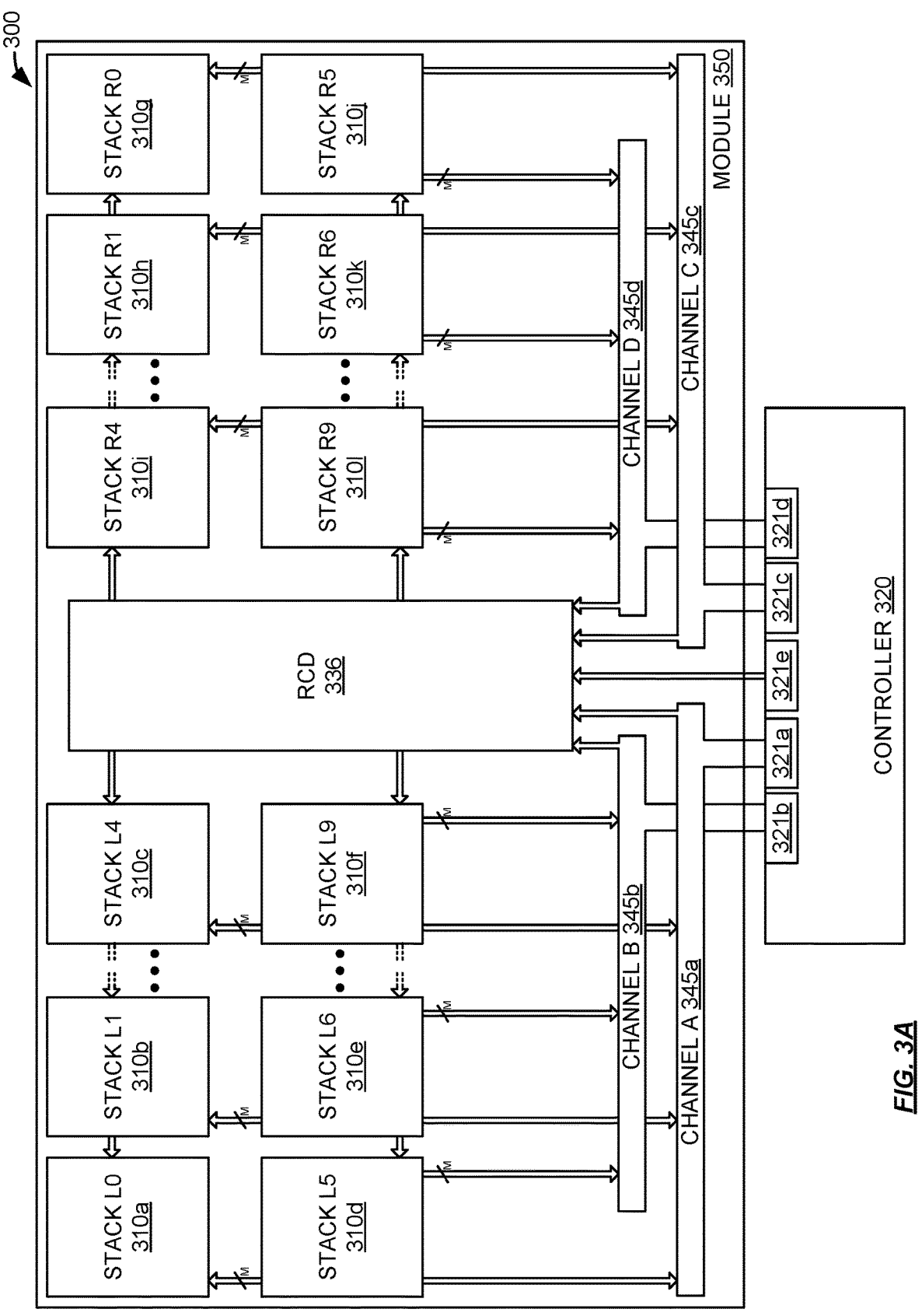
FIG. 3A is an illustration of memory system.

FIG. 3A is an illustration of memory system. In FIG. 3A, memory system 300 comprises module 350 and controller 320. Controller 320 includes memory channel interfaces 321a-321d, and common signal interface 321e. Memory channel interfaces 321a-321d are operatively coupled to channel A-D interfaces 345a-345d, respectively, of module 350. Commons signal interface 321e is operatively coupled to registering clock driver 336 of module 350.

In FIG. 3A, module 350 comprises left side dual channel DRAM stacks 310a-310f (representing ten DRAM stacks L0-L9 divided into five Channel A DRAM stacks L0-L4 and five Channel B DRAM stacks L5-L9), right side dual channel DRAM stacks R0-R9 310g-310l (representing ten DRAM stacks R0-R9 divided into five Channel C DRAM stacks R0-R4 and five Channel D DRAM stacks R5-R9), registering clock driver (RCD) 336, channel A interface 345a, channel B interface 345b, channel C interface 345c, and channel D interface 345d. RCD 336 receives certain signals (e.g., clock, chip select) that are common to the channel A-D interfaces 345a-345d from common signal interface 321e of controller 320.

At least the CA signals of channel A interface 345a are operatively coupled to RCD 336. RCD 336 operatively couples the CA signals of channel A interface 345a to the channel A DRAM stacks 310a-310c. Similarly, at least the CA signals of channel B interface 345b are operatively coupled to RCD 336. RCD 336 operatively couples the CA signals of channel B interface 345b to the channel B DRAM stacks 310d-310f.

At least the CA signals of channel C interface 346c are operatively coupled to RCD 336. RCD 336 operatively couples the CA signals of channel C interface 345c to the channel C DRAM stacks 310g-310i. Similarly, at least the CA signals of channel D interface 345d are operatively coupled to RCD 336. RCD 336 operatively couples the CA signals of channel D interface 345d to the channel D DRAM stacks 310j-310l.

DRAM stack L0 310a is operatively coupled to communicate M bits of data with channel A interface 345a. In an embodiment, M=4. DRAM stack L1 310b is operatively coupled to communicate M bits of data with channel A interface 345a, and so on for the rest of the channel A DRAM stacks L2-L4. DRAM stack L5 310d is operatively coupled to communicate M bits of data with channel B interface 345b. DRAM stack L6 310e is operatively coupled to communicate M bits of data with channel B interface 345b, and so on for the rest of the channel B DRAM stacks L7-L9. A like pattern is followed for the connection the remaining right side of DRAM stacks 310g-310l and their respective connections to the channel C and channel D interfaces 345c-345d (which, for the sake of brevity will not be detailed herein).

Figure 3B:
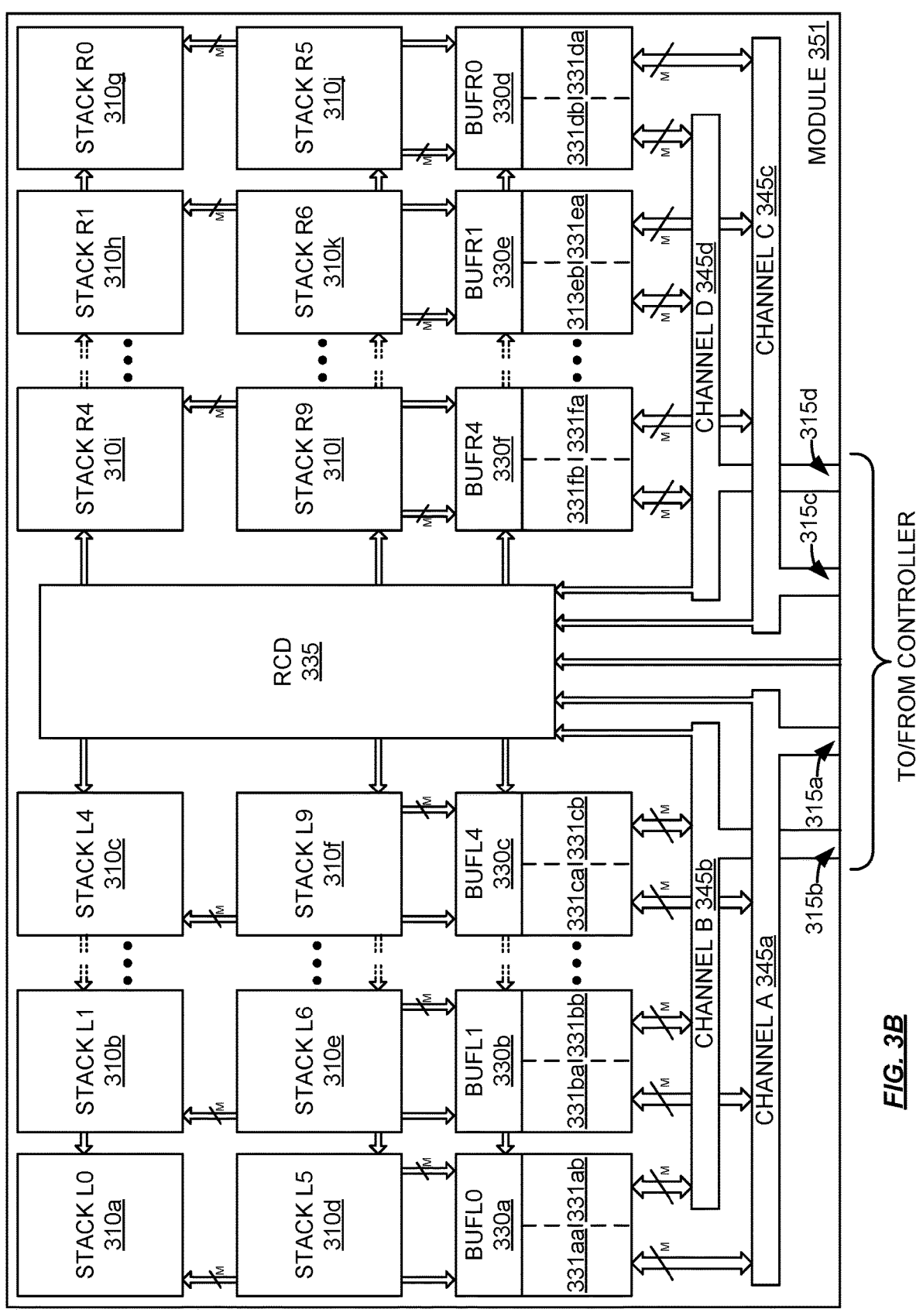
FIG. 3B is an illustration of a memory module.

FIG. 3B is an illustration of a memory module. In FIG. 3B, module 351 comprises left side dual channel DRAM stacks L0-L9 310a-310f (representing ten DRAM stacks L0-L9 divided into five Channel A DRAM stacks L0-L4 and five Channel B DRAM stacks L5-L9), right side dual channel DRAM stacks 310g-310l (representing ten DRAM stacks R0-R9 divided into five Channel C DRAM stacks R0-R4 and five Channel D DRAM stacks R5-R9), registering clock driver (RCD) 335, left side dual-channel buffers 330a-330c (representing five dual channel data buffer devices BUL0-BUFL4), right side dual-channel buffers 330f-330d (representing five dual channel data buffer devices BUR0-BUFR4), channel A interface 345a, channel B interface 345b, channel C interface 345c, and channel D interface 345d. RCD 335 receives certain signals (e.g., clock, chip select) that are common to the channel A-D interfaces 345a-345d from common signal interface 321e of controller 320.

At least the CA signals of channel A interface 345a are operatively coupled to RCD 335. RCD 335 operatively couples the CA signals of channel A interface 345a to the channel A DRAM stacks 310a-310c. Similarly, at least the CA signals of channel B interface 345b are operatively coupled to RCD 335. RCD 335 operatively couples the CA signals of channel B interface 345b to the channel B DRAM stacks 310d-310f.

At least the CA signals of channel C interface 346c are operatively coupled to RCD 335. RCD 335 operatively couples the CA signals of channel C interface 345c to the channel C DRAM stacks 310g-310i. Similarly, at least the CA signals of channel D interface 345d are operatively coupled to RCD 335. RCD 335 operatively couples the CA signals of channel D interface 345d to the channel D DRAM stacks 310j-310l.

DRAM stack L0 310a is operatively coupled to communicate M bits of data with channel A interface 315a via channel A interfaces 331*aa* of data buffer 330*a*. In an embodiment, M=4. DRAM stack L1 310*b* is operatively coupled to communicate M bits of data with channel A interface 345*a* via channel A interfaces 331*ba* of data buffer 330*b*, and so on for the rest of the channel A DRAM stacks L2-L4. DRAM stack L5 310*d* is operatively coupled to communicate M bits of data with channel B interface 345*b* via channel B interfaces 331*ab* of data buffer 330*a*. DRAM stack L6 310*e* is operatively coupled to communicate M bits of data with channel B interface 345*b* via channel B interfaces 331*bb* of data buffer 330*b*, and so on for the rest of the channel B DRAM stacks L7-L9. A like pattern is followed for the connection the remaining right side of DRAM stacks 310*g*-310*l* and their respective connections to the channel C and channel D interfaces 345*c*-345*d* (which, for the sake of brevity will not be detailed herein).

In an embodiment, when M=4, each channel A-D of a module 350-351 communicates 20 bits of data per timeslot with a controller 320 (e.g., 4 bits times five stacks L0-L4). As described herein, when half of the data burst is communicated to/from a first die of a stack 310*a*-310*l* (e.g., base die 110) and half is communicated to/from a second die of a stack 310*a*-310*l* (e.g., die 112), and these data halves are interleaved with each other using alternating successive timeslots, a first 20 bits communicated will be from/to a first set of dies in stacks 310*a*-310*l* and the successive (second) 20 bits communicated will be from/to a second set of dies in stacks 310*a*-310*l*. Thus, each accessed die in stacks 310*a*-310*l* will communicate 4 bits in only one of each two successive timeslots.

Figure 4A:
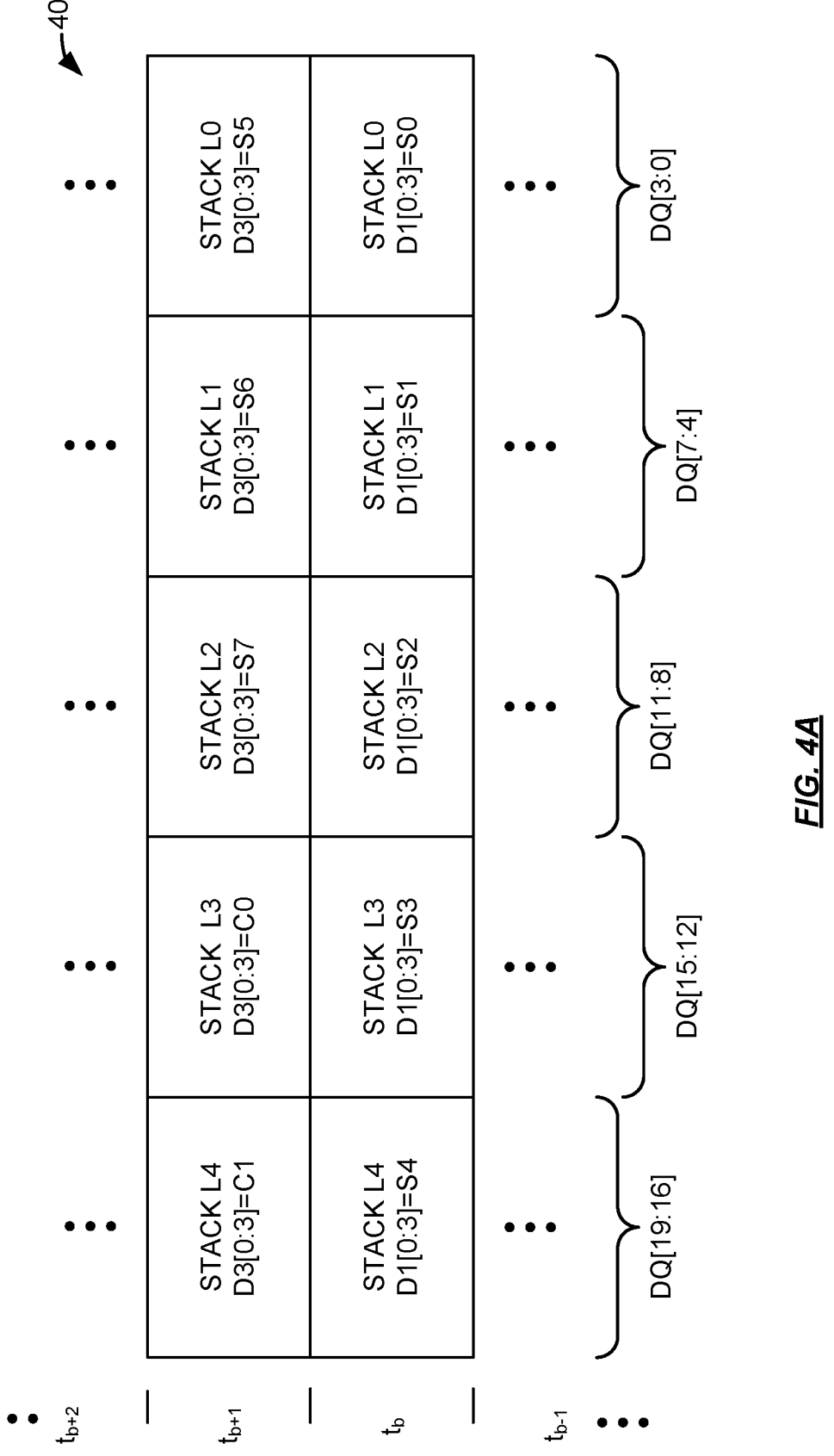
FIG. 4A-4B are illustrations of example codewords communicated across two timeslots of a burst.

Taking a channel A 315*a* access of channel A stacks L0-L4 310*a*-310*c* as an example of the foregoing, FIG. 4A illustrates an example error detection and correction encoding based on a codeword formed from two successive 20 bits communicated via channel A 315*a* where each symbol is 4 bits. In FIG. 4A, codeword 401 comprises data symbols S0-S7 and check symbols C0-C1. Each stack L0-L4 contributes 8 bits to codeword 401 where four bits are from a first die (e.g., die 111, and denoted D1[0:3] in FIG. 4A) in the stack and four bits are from a second die (e.g., die 113, and denoted D3[0:3] in FIG. 4A) in the stack that has been concurrently accessed. In other words, each 4-bit data symbol S0-S7 and each 4-bit check symbol C0-C1 consists of four bits of data from a single, unique, die on the module 350-351. In other words, each die only contributes one symbol S0-S7 or C0-C1 to codeword 401. Thus, when codeword 401 is generated using a Reed-Solomon coding of RS(10,8), a failure of a die (whether partial or total) can be corrected by controller 320. This level of error correction and detection is also known as "chipkill". Note the other dies of a component stack L0-L4 may still be functioning and not affecting the operation of the other dies of the stack as discussed herein with reference to FIG. 1. Thus, this level of error correction and detection may also be known as "diekill" when used with the stacks of FIGS. 1, and 3A-3C.

In an embodiment, when M=4, and SERDES 1107 communicates N/2 bits from each concurrently accessed die (e.g., die 111 and die 113), each channel A-D of a module 350-351 communicates 20 bits of data per timeslot with a controller 320. As described herein, when half of the data burst is communicated to/from a first die of a stack 310*a*-310*l* (e.g., base die 110) and half is communicated to/from a second die of a stack 310*a*-310*l* (e.g., die 112), each 20 bits communicated per timeslot will be from/to all of the accessed dies. Thus, each accessed die in stacks 310*a*-310*l* will communicate 4 bits spread over two successive timeslots.

Figure 4B:
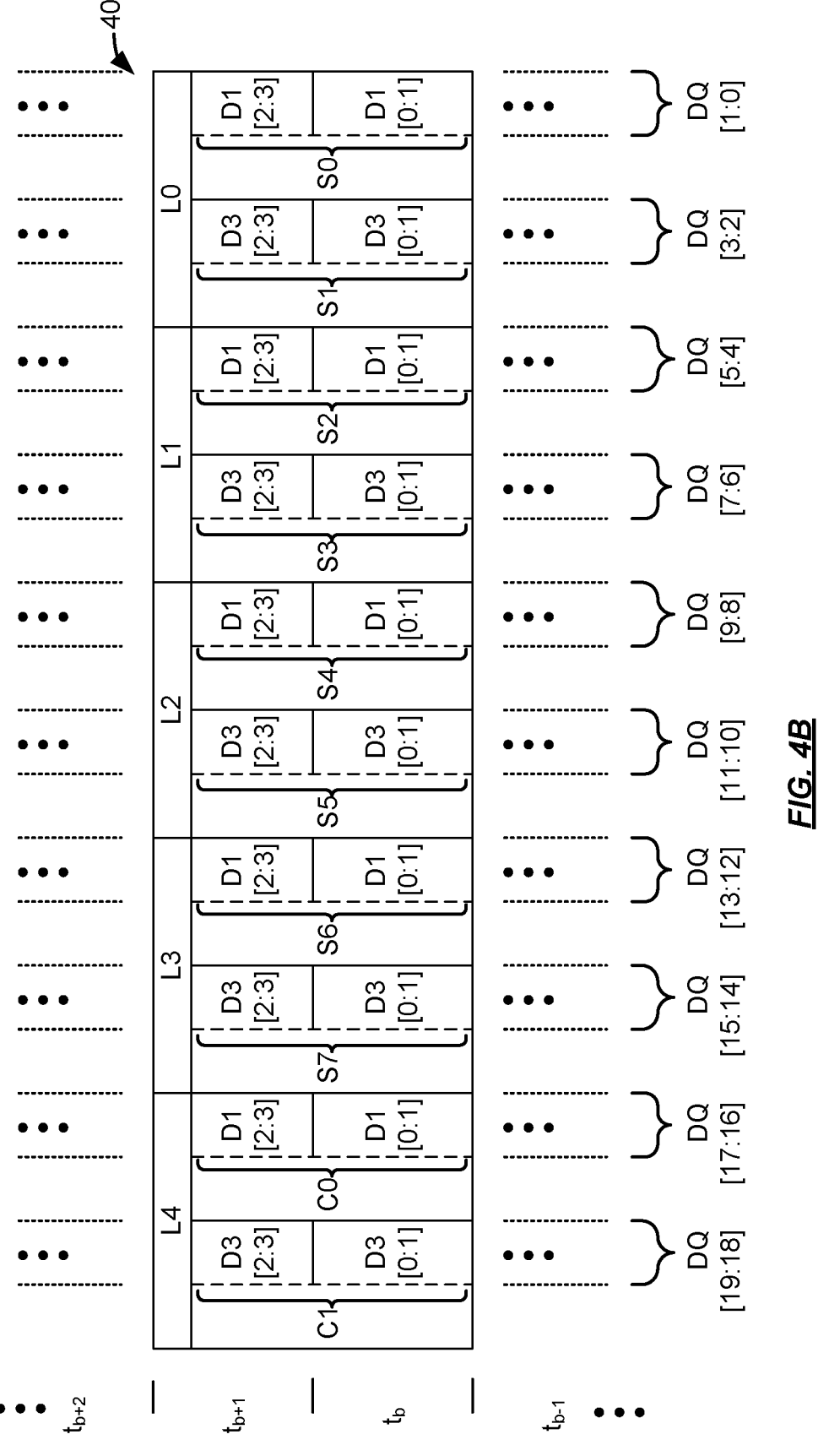

Taking a channel A 315*a* access of channel A stacks L0-L4 310*a*-310*c* as an example of the foregoing, FIG. 4B illustrates an example error detection and correction encoding based on a codeword formed from two successive 20 bits communicated via channel A 315*a* where each symbol is 4 bits, and each symbol is spread over two successive timeslots. In FIG. 4B, codeword 402 comprises data symbols S0-S7 and check symbols C0-C1. Each stack L0-L4 contributes 8 bits to codeword 402 where four bits are from a first die (e.g., die 111, and denoted D1[0:3] in FIG. 4B) in the stack and four bits are from a second die (e.g., die 113, and denoted D3[0:3] in FIG. 4B) in the stack that has been concurrently accessed. In other words, each 4-bit data symbol S0-S7 and each 4-bit check symbol C0-C1 spread over two successive timeslots consists of four bits of data from a single, unique, die on the module 350-351. In other words, each die only contributes one symbol S0-S7 or C0-C1 to codeword 402. Thus, similar to codeword 401, when codeword 402 is generated using a Reed-Solomon coding of RS(10,8), a failure of a die (whether partial or total) can be corrected by controller 320.

Figure 5:
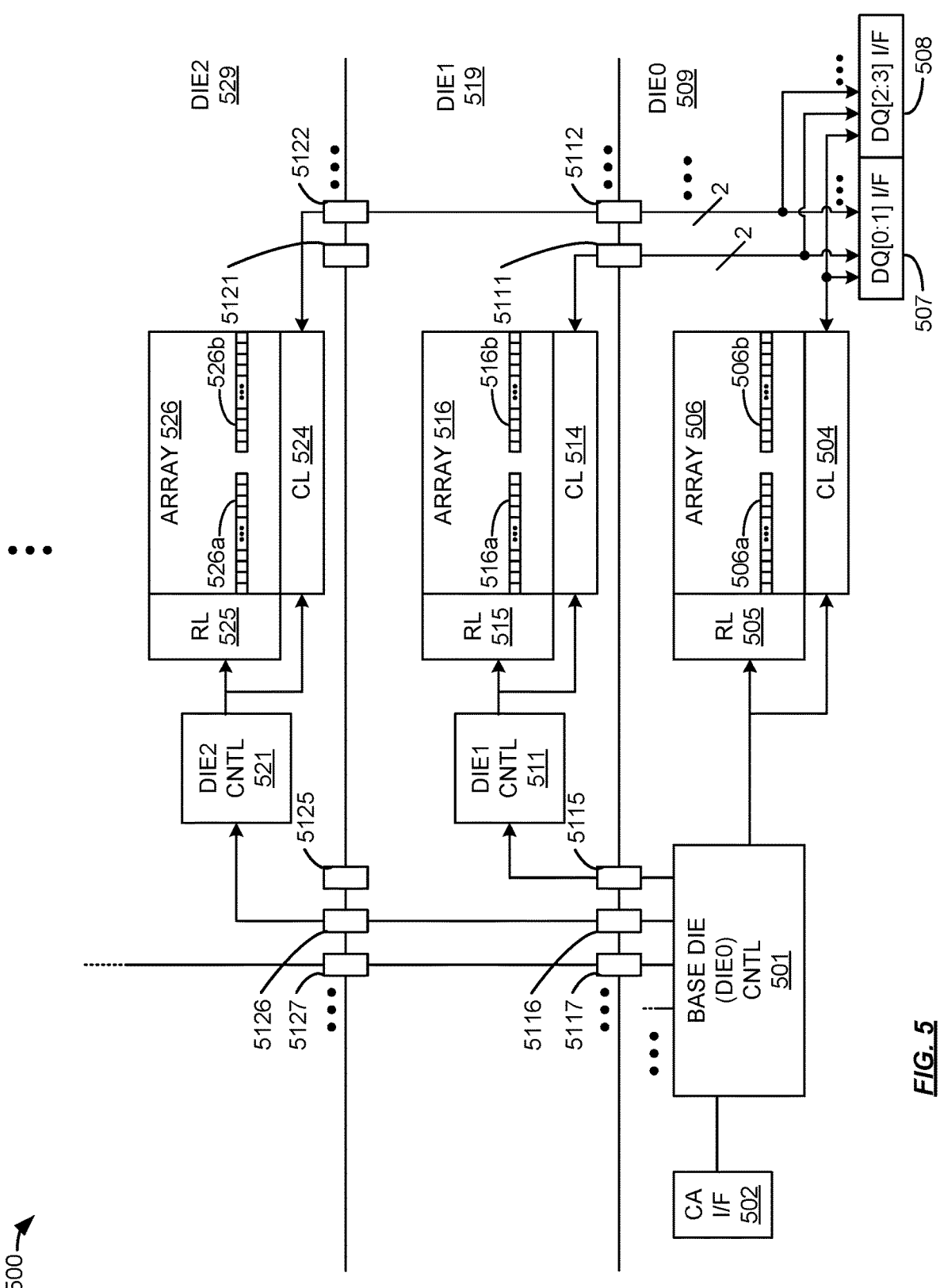
FIG. 5 is an illustration of a stack of DRAM devices.

FIG. 5 is an illustration of a stack of DRAM devices. In FIG. 5, stacked die component 500 comprises base DRAM die 509, first stacked DRAM die 519, second stacked DRAM die 529, and at least one additional stacked DRAM die not shown in FIG. 5. Base die 509 includes base die control 501, command/address (CA) interface 502, column logic 504, row logic 505, memory array 506, least significant bits (LSB) DQ interface 507, and most significant bits (MSB) DQ interface 508. The rows of memory array 506 are divided into independently accessed half-rows 506*a*-506*b*.

First stacked die 519 includes data TSVs 5111-5112, CA TSVs 5115-5117, die control 511, column logic 514, row logic 515, and memory array 516. The rows of memory array 516 are divided into independently accessed half-rows 516*a*-516*b*. Second stacked die 529 includes data TSVs 5121-5122, CA TSVs 5125-5127, die control 521, column logic 524, row logic 525, and memory array 526. The rows of memory array 526 are divided into independently accessed half-rows 526*a*-526*b*.

CA interface 502 of based die 509 is operatively coupled to base die control 501. Base die control 501 is operatively coupled to row logic 505 and column logic 504. Row logic 505 and column logic 504 are operatively coupled to array 506. Column logic 504 is also operatively coupled to DQ interfaces 507-508. Base die control 501 is operatively coupled to die control 511 of first stacked die 519 via TSVs 5115. Base die control 501 is operatively coupled to die control 521 of second stacked die 529 via TSVs 5116 and TSVs 5126. Base die control 501 is operatively coupled to die control of at least one other stacked die (not shown in FIG. 5) via TSVs 5117 and TSVs 5127. DQ interfaces 507-508 are operatively coupled to column logic of first stack die via TSVs 5111. DQ interfaces 507-508 are operatively coupled to column logic of second stack die via TSVs 5112 and 5122. DQ interfaces 507-508 are operatively coupled to column logic of at least one other stacked die (not shown in FIG. 5) via TSVs of first stacked die 519 and TSVs of second stacked die 529 (not shown in FIG. 5).

In an embodiment, base die 509 receives, via CA interface 502, commands and addresses that include a chip identification number (CID) value. When base die control 501 receives a CID value, base die control 501 decodes the CID value and determines which of dies 509-529, etc. is being accessed by the externally received CID value. In the second configuration, based on the external CID value, base die control 501 determines a second die 509-529 to be accessed concurrently. Table 1 and Table 2 illustrate example decodings that may be used to select a second die based on the external CID value. In Table 1 and Table 2, the first listed die to be accessed is the externally addressed die. The second listed die is an example decoding that may be used as the second die. Thus, for example, using the Table 1 decoding, the external CID value of '1' (hex) would, for a 16 die stack, select die #1 as the externally addressed die and die #3 for the second die. In another example, using the Table 2 decoding, a CID value of 'C' (hex) would select die #12 as the externally addressed die and die #4 for the second die.

In an embodiment, base die 509 ignores the most significant bit (MSB) of row and read/write addresses received via CA interface 502. Rather, base die control 501 used the CID decoding to determine which half-row 506a-526a 506b-525b is accessed in each of the externally addressed die and the second die. In other words, the MSB of the row or column address sent by base die control to row logic 505-525 or column logic 504-524 is based on whether the die was the externally addressed, by the CID value, or was the second die addressed by the decoding of the CID value by base die control 501.

For example, using the decoding of Table 1 and an 8 die stack, an external CID value of 2 (hex) addresses die #2 as the externally addressed die and die #0 as the second die. Thus, in this example and embodiment, base die control 501 would cause die control 521 to access a first half-row 526a (left side) of array 526 and also access a second half-row 506b (right side) of array 506. Conversely, an external CID value of 0 (hex) addresses die #0 as the externally addressed die and die #2 as the second die. Thus, in this example and embodiment, base die control 501 would access a first half-row 506a (left side) of array 506 and also cause die control 521 to access a second half-row 526b (right side) of array 526.

Alternatively, LSB of an external CID is used to select one of two half-rows. For example, CID=10 (binary) accesses a first half row of die #0 and die #1. CID=11 (binary) accesses a second half row of die #0 and die #1. In this embodiment, one bit of the column address is not used.

In FIG. 5, each die 509-529 provides two (2) data bits per burst timeslot to DQ interfaces 507-508. Thus, if a die 509-529 is faulty, only 2 data bits of a timeslot are incorrect. If the codewords making up a burst are protected by an appropriate error detection and correction coding (e.g., RS(10,8)), a 'bounded fault' level of error correction and detection may be achieved.

FIG. 6 is a flowchart illustrating a method of accessing multiple devices in a stack of DRAM devices. One or more of the steps illustrated in FIG. 6 may be performed by, for example, stacked die component 100, memory system 300, module 351, stacked die component 500, and/or their components. By a first memory device, a first memory access command associated with a first chip identification value is received (602). For example, base die 110 may receive a memory access command that includes a chip identification value.

In response to the first memory access command and the first chip identification value, the first memory access command is performed by the first memory device and a second memory device that is electrically coupled to and stacked with the first memory device (604). For example, in response to the memory access command and chip identification value received by base die 110, base die 110 may access memory array 1106 and cause memory array 1126 to be accessed by die 112.

FIG. 7 is a flowchart illustrating a method of accessing devices in a stack of DRAM devices. One or more of the steps illustrated in FIG. 7 may be performed by, for example, stacked die component 100, memory system 300, module 351, stacked die component 500, and/or their components. By a first memory device, a first memory access command associated with a first chip identification value is received (702). For example, base die 110 may receive a memory access command that includes a chip identification value.

Based on the first chip identification value, determine a second memory device that is electrically coupled to and stacked with the first memory device to perform the first memory access command (704). For example, base die 110 may determine, based on the chip identification value, that die 111 is to perform the first memory access command because base die 110 was externally addressed by the chip identification value. Based on the first chip identification value, determine a third memory device that is electrically coupled to and stacked with the first memory device to perform the first memory access command (706). For example, base die 110 may determine, based on the chip identification value, that die 113 is to also perform the first memory access command because die 113 is associated with the externally addressed by the chip identification value (e.g., by decoding in accordance with Table 1 or Table 2).

Data associated with the first memory access command is communicated with the second memory device and the third memory device (708). For example, data associated with the first memory access command may be communicated with die 111 and die 113. In an example, the data communicated with die 111 and die 113 and associated with the first memory access command may be interleaved while being communicated with base die 110. The data communicated with die 111 and die 113 and associated with the first memory access command may be communicated with base die 110 and dies 111-113 may be communicated in parallel.

FIG. 8 is a flowchart illustrating a method of accessing half-rows in a stack of DRAM devices. One or more of the steps illustrated in FIG. 8 may be performed by, for example, stacked die component 100, memory system 300, module 351, stacked die component 500, and/or their components. By a first memory device, a first memory access command associated with a first chip identification value is received (802). For example, base die 509 may receive, via CA interface 502, a memory access command that includes a chip identification value.

Based on the first chip identification value, a first half-row of a second memory device that is electrically coupled to and stack with the first memory device is selected to perform the first memory access command (804). For example, based on an externally received chip identification value, base die 509 may decode the CID value and determines that die 519 is being accessed by an externally received CID value and therefore the left side half-row 516a of memory array 516 is to be accessed by the first memory access command. Based on the first chip identification value, a second half-row of a third memory device that is electrically coupled to and stack with the first memory device is selected to perform the first memory access command (806). For example, based on an externally received chip identification value, base die 509 may decode the CID value and determines that die 529 is also being accessed by a decoded CID value and therefore because the CID value was decoded, the right side half-row 526b of array 526 is to be accessed by the first memory access command.

The data associated with the first memory access command is communicated with the first half-row and the second half-row. For example, LSB DQ interface 507 may communicate data associated with the first memory access command with right side half-row 526*b* and MSB DQ interface 508 may communicate data associated with the first memory access command with left side half-row 516*a*.

FIG. 9 is a flowchart illustrating a method of accessing half-rows of two different DRAM devices in a stack. One or more of the steps illustrated in FIG. 9 may be performed by, for example, stacked die component 100, memory system 300, module 351, stacked die component 500, and/or their components. A memory device stack is configured to access a first half-row of a first memory device in the memory device stack and a second half-row of a second memory device in the memory device stack in response to a first chip identification value (902). For example, base die 509 may be configured to access the left side half-rows 516*a* of die 519 and the right side half-rows 529*b* of die 529 in response to a single CID value associated with a single memory access command. Base die 509 may be configured by, for example, setting a mode or mode indicator in base die control 501. Base die 509 may be configured by, for example, configuring associations between half rows 516*a*-516*b* in die 519 and half-rows 526*a*-526*b* in die 529 (e.g., in a lookup table, etc.) and CID values.

By the memory device stack, a first memory access command associated with the first chip identification value is received (904). For example, CA interface 502 of base die 509 may receive a first memory access command that includes the first chip identification value. Based on the first chip identification value, a first half-row of the first memory device is accessed (906). For example, based on the received first chip identification value, base die 509 may use the configured associations between the first chip identification value and the left side half-rows of die 519 to access a left side half-row 516*a*. Based on the first chip identification value, a second half-row of the second memory device is accessed (908). For example, based on the received first chip identification value, base die 509 may use the configured associations between the first chip identification value and the right side half-rows of die 529 to access a right side half-row 526*b*.

It should be understood that FIG. 9 contemplates operations when the memory device stack (e.g., stacked die component 500) is configured to access two die in response to a single CID value. If the memory device stack is configured to access a single die in response to a single CID value, as discussed herein, both the left and right side half-rows are accessed in the die addressed by the CID value and all data is accessed in that die.

The foregoing has been presented in terms of memory arrays (e.g., memory arrays 1106-1136 and memory arrays 506-526) that are dynamic (i.e., DRAM arrays). It should be understood, however that other types of memory arrays, for example, static random access memory (SRAM) arrays, non-volatile memory arrays (such as flash), conductive bridging random access memory (CBRAM—a.k.a., programmable metallization cell—PMC), resistive random access memory (a.k.a., RRAM or ReRAM), or magnetoresistive random-access memory (MRAM), and the like may be or comprise memory arrays included in the memory device stacks or components disclosed herein.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of stacked die component 100, memory system 300, module 351, stacked die component 500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
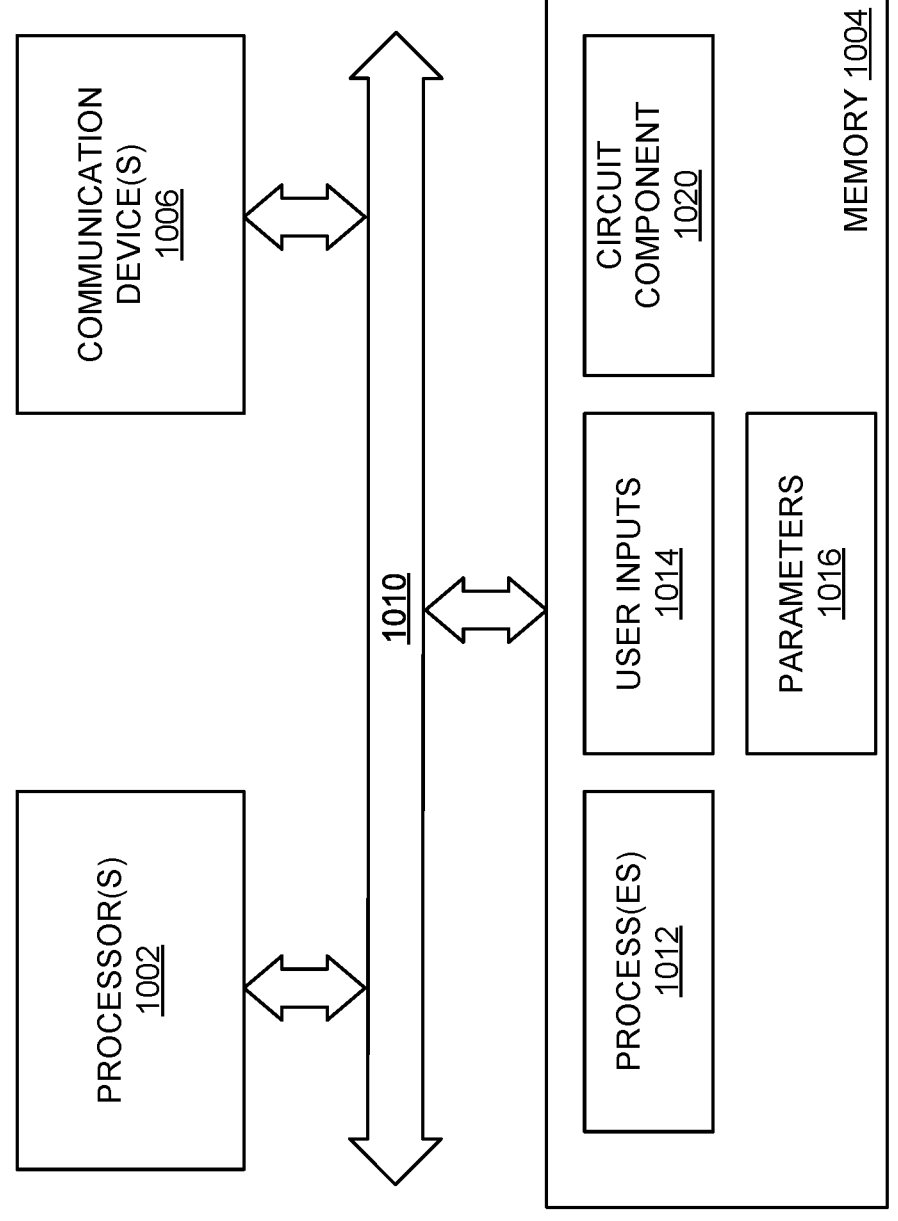
FIG. 10 is a block diagram of a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of stacked die component 100, memory system 300, module 351, stacked die component 500, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

Implementations discussed herein include, but are not limited to, the following examples:

Example 1: An integrated circuit stack, comprising: an external command/address (CA) interface to receive commands and addresses from a device external to the integrated circuit stack; a first memory device comprising at least a first memory array; and a second memory device comprising at least a second memory, the second memory device electrically coupled to and stacked with the first memory device, the first memory device and the second memory device to be addressable by a first chip identification value received via the external CA interface.

Example 2: The integrated circuit stack of example 1, wherein, when the integrated circuit stack is in a first mode, the first memory device and the second memory device are addressed by the first chip identification value.

Example 3: The integrated circuit stack of example 2, wherein, when the integrated circuit stack is in a second mode, the first memory device is addressed by a second chip identification value and the second memory device is addressed by a third chip identification value that is not equal to the second chip identification value.

Example 4: The integrated circuit stack of example 3, wherein, when the integrated circuit stack is in the first mode, the first chip identification value has a one bit less than the second chip identification value and a CA bit field used for the one bit carries a row address bit.

Example 5: The integrated circuit stack of example 2, wherein at least one of the first memory device and the second memory device are accessed via through-silicon vias communicating signals among devices of the integrated circuit stack.

Example 6: The integrated circuit stack of example 5, wherein first data signals communicated with the first memory device and second data signals communicated with the second memory device are communicated via different sets of through-silicon vias.

Example 7: The integrated circuit stack of example 2, wherein first data signals communicated with the first memory device and second data signals communicated with the second memory device are time-multiplexed on an external data (DQ) interface to communicate with the device external to the integrated circuit stack.

Example 8: The integrated circuit stack of example 2, wherein first data signals communicated with the first memory device and second data signals communicated with the second memory device are communicated on an external data (DQ) interface with the device external to the integrated circuit stack using different interface connections.

Example 9: An assembly, comprising: an external command/address (CA) interface to receive commands and addresses from a device external to the assembly; a first memory integrated circuit coupled to the external CA interface and comprising a first memory array; and a second memory integrated circuit comprising a second memory array and being electrically coupled to and stacked with the first memory integrated circuit, the first memory integrated circuit configurable to concurrently access the first memory array and the second memory array in response to a first chip identification value received via the external CA interface.

Example 10: The assembly of example 9, where in the first chip identification value includes a bit that is used in determining a first plurality of cells to be accessed in the first memory array and a second plurality of cells to be accessed in the second memory array.

Example 11: The assembly of example 9, wherein, when the first memory integrated circuit is in a first mode, the first chip identification value concurrently accesses the first memory array and the second memory array.

Example 12: The assembly of example 11, wherein, when the first memory integrated circuit is in a second mode, the first memory integrated circuit is addressed by a second chip identification value and the second memory integrated circuit is addressed by a third chip identification value that is not equal to the second chip identification value.

Example 13: The assembly of example 11, further comprising: a third memory integrated circuit comprising a third memory array and being electrically coupled to and stacked with the first memory integrated circuit and the second memory integrated circuit and the second memory integrated circuit and the third memory integrated circuit are accessed via through-silicon vias communicating signals among integrated circuits of the assembly.

Example 14: The assembly of example 13, wherein first data signals communicated with the second memory integrated circuit and second data signals communicated with the third memory integrated circuit are communicated among integrated circuits of the assembly using different sets of through-silicon vias.

Example 15: The assembly of example 13, wherein first data signals communicated with the second memory integrated circuit and second data signals communicated with the third memory integrated circuit are time-multiplexed on an external data (DQ) interface to communicate with the device external to the assembly.

Example 16: The assembly of example 13, wherein first data signals communicated with the second memory integrated circuit and second data signals communicated with the third memory integrated circuit are communicated on an external data (DQ) interface with the device external to the assembly using different interface connections.

Example 17: A method, comprising: receiving, by a first memory device, a first memory access command associated with a first chip identification value; and in response to the first memory access command and the first chip identification value, performing, by the first memory device and a second memory device that is electrically coupled to and stacked with the first memory device, the first memory access command.

Example 18: The method of example 17, further comprising: configuring the first memory device and the second memory device to respond to commands associated with the first chip identification value.

Example 19: The method of example 17, further comprising: time multiplexing data from the first memory device with data from the second memory device received in response to the first memory access command.

Example 20: The method of example 17, further comprising: outputting data from the first memory device received in response to the first memory access command on a first set of data interface connections; and outputting data from the second memory device received in response to the first memory access command on a second set of data interface connections, where the first set of data interface connections and second set of data interface connections are non-overlapping sets.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit stack, comprising:
an external command/address (CA) interface to receive commands and addresses from a device external to the integrated circuit stack;
a first memory device comprising at least a first memory array; and
a second memory device comprising at least a second memory, the second memory device electrically coupled to and stacked with the first memory device, wherein when the integrated circuit stack is in a first mode the first memory device and the second memory device to be addressable by a first chip identification value received via the external CA interface, and wherein when the integrated circuit stack is in a second mode, the first memory device is addressed by a second chip identification value and the second memory device is addressed by a third chip identification value that is not equal to the second chip identification value.

2. The integrated circuit stack of claim 1, wherein the first chip identification value is equal to the second chip identification value.

3. The integrated circuit stack of claim 1, wherein, the first memory integrated circuit is to store a plurality of check symbols.

4. The integrated circuit stack of claim 1, wherein, when the integrated circuit stack is in the first mode, the first chip identification value has a one bit less than the second chip identification value and a CA bit field used for the one bit carries a row address bit.

5. The integrated circuit stack of claim 1, wherein at least one of the first memory device and the second memory device are accessed via through-silicon vias communicating signals among devices of the integrated circuit stack.

6. The integrated circuit stack of claim 5, wherein first data signals communicated with the first memory device and second data signals communicated with the second memory device are communicated via different sets of through-silicon vias.

7. The integrated circuit stack of claim 1, wherein first data signals communicated with the first memory device and second data signals communicated with the second memory device are time-multiplexed on an external data (DQ) interface to communicate with the device external to the integrated circuit stack.

8. The integrated circuit stack of claim 1, wherein first data signals communicated with the first memory device and second data signals communicated with the second memory device are communicated on an external data (DQ) interface with the device external to the integrated circuit stack using different interface connections.

9. An assembly, comprising:
an external command/address (CA) interface to receive commands and addresses from a device external to the assembly;
a first memory integrated circuit coupled to the external CA interface and comprising a first memory array; and
a second memory integrated circuit comprising a second memory array and being electrically coupled to and stacked with the first memory integrated circuit, the first memory integrated circuit configurable to, based on a first chip identification value associated with both the first memory integrated circuit and the second memory integrated circuit and received via the external CA interface, concurrently access both the first memory array of the first memory integrated circuit and the second memory array of the second memory integrated circuit.

10. The assembly of claim 9, where in the first chip identification value includes a bit that is used in determining a first plurality of cells to be accessed in the first memory array and a second plurality of cells to be accessed in the second memory array.

11. The assembly of claim 9, wherein, when the first memory integrated circuit is in a first mode, the first chip identification value concurrently accesses the first memory array and the second memory array.

12. The assembly of claim 11, wherein, when the first memory integrated circuit is in a second mode, the first memory integrated circuit is addressed by a second chip identification value and the second memory integrated circuit is addressed by a third chip identification value that is not equal to the second chip identification value.

13. The assembly of claim 11, further comprising:
a third memory integrated circuit comprising a third memory array and being electrically coupled to and stacked with the first memory integrated circuit and the second memory integrated circuit and the second memory integrated circuit and the third memory integrated circuit are accessed via through-silicon vias communicating signals among integrated circuits of the assembly.

14. The assembly of claim 13, wherein first data signals communicated with the second memory integrated circuit and second data signals communicated with the third memory integrated circuit are communicated among integrated circuits of the assembly using different sets of through-silicon vias.

15. The assembly of claim 13, wherein first data signals communicated with the second memory integrated circuit and second data signals communicated with the third memory integrated circuit are time-multiplexed on an external data (DQ) interface to communicate with the device external to the assembly.

16. The assembly of claim 13, wherein first data signals communicated with the second memory integrated circuit and second data signals communicated with the third memory integrated circuit are communicated on an external data (DQ) interface with the device external to the assembly using different interface connections.

* * * * *